(12) United States Patent
Admon et al.

(10) Patent No.: US 10,915,329 B2
(45) Date of Patent: Feb. 9, 2021

(54) DELAYED RESET FOR CODE EXECUTION FROM MEMORY DEVICE

(71) Applicant: Winbond Electronics Corporation, Taichung (TW)

(72) Inventors: Itay Admon, Pardes-Hanna (IL); Nir Tasher, Herzliya (IL); Mark Luko, Herzliya (IL)

(73) Assignee: WINBOND ELECTRONICS CORPORATION, Taichung (TW)

( * ) Notice: Subject to any disclaimer, the term of this patent is extended or adjusted under 35 U.S.C. 154(b) by 89 days.

(21) Appl. No.: 16/283,774

(22) Filed: Feb. 24, 2019

(65) Prior Publication Data

US 2020/0272480 A1  Aug. 27, 2020

(51) Int. Cl.
  *G06F 9/00* (2006.01)
  *G06F 9/4401* (2018.01)
  *G06F 9/30* (2018.01)

(52) U.S. Cl.
  CPC ........ G06F 9/4403 (2013.01); G06F 9/30043 (2013.01); *G06F 9/4401* (2013.01)

(58) Field of Classification Search
  CPC .............. G06F 9/4403; G06F 9/30043
  USPC .................................................. 713/2
  See application file for complete search history.

(56) References Cited

U.S. PATENT DOCUMENTS

| | | | | |
|---|---|---|---|---|
| 5,737,231 A * | 4/1998 | Pyle | ............... | G01R 19/2513 324/76.11 |
| 5,835,784 A * | 11/1998 | Gillespie | ............ | G06F 13/4045 710/10 |
| 8,275,981 B2 | 9/2012 | Moshayedi | | |
| 9,047,471 B2 * | 6/2015 | Polzin | ................. | G06F 21/74 |
| 2007/0260867 A1 * | 11/2007 | Ethier | ................... | G06F 9/4418 713/2 |
| 2008/0263256 A1 * | 10/2008 | Gudeth | ................ | G06F 12/145 711/2 |
| 2011/0022829 A1 * | 1/2011 | Moshayedi | .......... | G06F 9/4401 713/2 |
| 2016/0085559 A1 * | 3/2016 | Todd | ..................... | G06F 9/4403 713/1 |

OTHER PUBLICATIONS

Tanzawa et al., "A Process- and Temperature-Tolerant Power-On Reset Circuit with a Flexible Detection Level Higher than the Bandgap Voltage", IEEE International Symposium on Circuits and Systems, pp. 2302-2305, May 18-21, 2008.

Le et al., "A Long Reset-Time Power-On Reset Circuit With Brown-Out Detection Capability", IEEE Transactions On Circuits and Systems—II: Express Briefs, vol. 58, No. 11, pp. 778-782, Nov. 2011.

\* cited by examiner

*Primary Examiner* — Volvick Derose
(74) *Attorney, Agent, or Firm* — Kligler & Associates Patent Attorneys Ltd

(57) ABSTRACT

A memory device includes a non-volatile memory (NVM) and circuitry. The circuitry is configured to initialize and prepare the NVM for executing memory-access operations for a processor, and to ascertain that no memory-access operations are received from the processor before the NVM is ready, by preventing the processor from bootstrapping during at least part of initialization and preparation of the NVM.

10 Claims, 6 Drawing Sheets

DELAYED RESET FOR CODE EXECUTION FROM MEMORY DEVICE

FIELD OF THE INVENTION

The present invention relates generally to digital systems, and particularly to methods and apparatuses for resetting a system comprising a microcontroller and a non-volatile memory.

BACKGROUND OF THE INVENTION

Digital systems typically comprise one or more processors (e.g., CPU, MCU, GPU, DSP, and others), and use nonvolatile memory (e.g., Flash memory device) to store software or firmware code, as well as data.

Various techniques are known in the art for resetting and initializing processors and their peripherals, e.g., on power-up. For example, Le et al., describe a power-on-reset (POR) circuit in "A Long Reset-Time Power-On Reset Circuit with Brown-Out Detection Capability," IEEE Transactions on Circuits and Systems II: Express Briefs, 58-II(11), November, 2011, pages.

Another POR circuit is described by Tanzawa, in "A process and temperature-tolerant power-on reset circuit with a flexible detection level higher than the bandgap voltage," IEEE International Symposium on Circuits and Systems (ISCAS), June, 2008. This paper describes the operation principle of a power-on-reset circuit based on a bandgap reference, enabling a designed output voltage higher than the Bandgap voltage of 1.25V.

SUMMARY OF THE INVENTION

An embodiment of the present invention that is described herein provides a memory device including a non-volatile memory (NVM) and circuitry. The circuitry is configured to initialize and prepare the NVM for executing memory-access operations for a processor, and to ascertain that no memory-access operations are received from the processor before the NVM is ready, by preventing the processor from bootstrapping during at least part of initialization and preparation of the NVM.

In some embodiments, the circuitry is configured to prevent the processor from bootstrapping by holding the processor in a reset state during the at least part of the initialization and preparation of the NVM. In an example embodiment, the NVM is configured to store boot code of the processor, and the circuitry is configured to release the processor from the reset state after the at least part of the initialization and preparation of the NVM, and to subsequently provide the boot code to the processor.

In other embodiments, the NVM is configured to store boot code of the processor, and the circuitry is configured to prevent the processor from bootstrapping by (i) during the at least part of the initialization and preparation of the NVM, responding to a request from the processor for the boot code by providing an alternative code that prevents the processor from bootstrapping, and (ii) after the at least part of the initialization and preparation of the NVM, responding to a subsequent request from the processor for the boot code by providing the boot code.

In an embodiment, the alternative code causes the processor to repeatedly loop until the at least part of the initialization and preparation of the NVM is complete. In another embodiment, the alternative code includes a first part that is executed once, and a second part that is executed repeatedly until the at least part of the initialization and preparation of the NVM is complete. In an example embodiment, the first part includes instructions that load a register of the processor.

In some embodiments, the NVM and the circuitry are packaged in a same Integrated Circuit (IC) package.

There is additionally provided, in accordance with an embodiment of the present invention, a method in a memory device. The method includes, using circuitry in the memory device, initializing and preparing a non-volatile memory (NVM) in the memory device for executing memory-access operations for a processor, and ascertaining, by the circuitry in the memory device, that no memory-access operations are received from the processor before the NVM is ready, by preventing the processor from bootstrapping during at least part of initialization and preparation of the NVM.

The present invention will be more fully understood from the following detailed description of the embodiments thereof, taken together with the drawings in which:

DETAILED DESCRIPTION OF EMBODIMENTS

Figure 1:
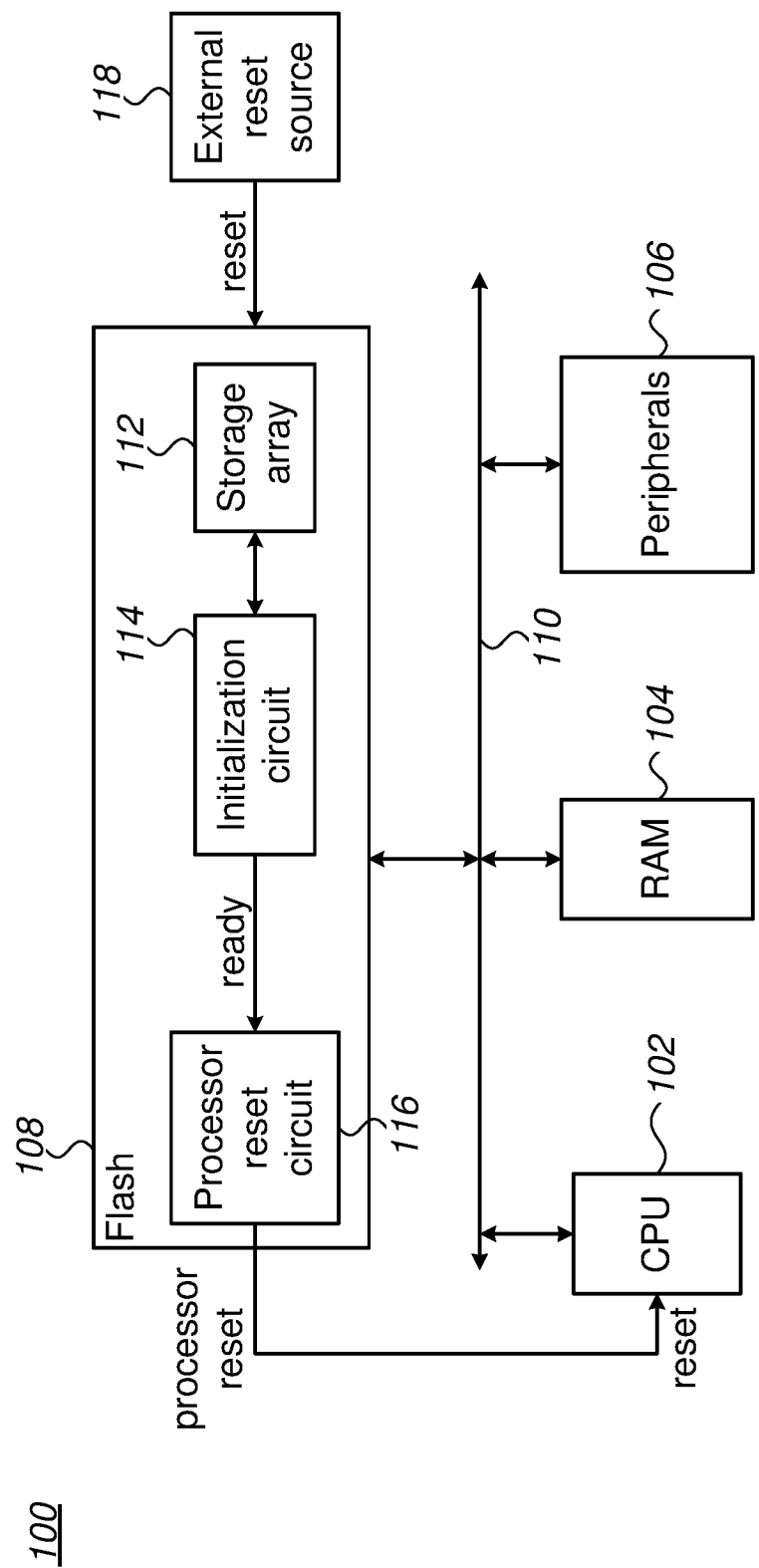
FIG. 1 is a block diagram that schematically illustrates a computer system with processor-reset that is generated by a Flash device having a system-reset input, in accordance with an embodiment of the present invention.

In computer systems that comprise a processor (e.g., a Central Processing Unit (CPU)) and a memory device, the initialization time of the memory device may be longer than that of the processor. In such a case, after reset or power-up, the processor may be ready for execution before the memory device is ready to provide the required code or data, thus, preventing successful computer system boot.

This scenario is particularly common when the boot code of the processor is stored in a Flash device—Flash devices may require a long period of time to get ready, including time required to complete some analog operations, time to run a built-in-self-test (BIST) and/or time required to perform security related operations.

Hence, in computer systems that boot from code stored in a Flash device, it may be necessary to provide the processor with a delayed reset, so that the processor will attempt to boot only when the Flash device is ready.

One way to generate a properly-delayed reset for the processor is to use a reset circuit with a time delay that is longer than the maximum expected time that the Flash device may need to get ready. This, however, requires the addition of a special circuit; and, due to variations and uncertainty in the time required for the Flash device to get ready, may be longer than necessary, further delaying the start-up of the computer system.

Embodiments of the present invention that are described herein provide improved methods and devices for ensuring that the processor starts the boot sequence shortly after (and never before) the memory device is ready. The description that follows refers mainly to a CPU and a Flash device, by way of example, but the disclosed techniques are applicable to other suitable types of processors and memory/storage devices.

In some embodiments, the memory device (e.g., Flash device) comprises a non-volatile memory (NVM) array, and circuitry, both packaged together in the same Integrated Circuit (IC) package. Among other tasks, the circuitry is configured to initialize and prepare the NVM for executing memory-access operations for the processor (e.g., CPU), and to ascertain that no memory-access operations are received from the processor before the NVM is ready. The circuitry ascertains the above condition by preventing the processor from bootstrapping during at least part of the initialization and preparation of the NVM.

The circuitry in the memory device may use various techniques for preventing the processor from bootstrapping until the NVM is ready. Several examples are described in details below. The techniques described herein are provided purely by way of example, and any other suitable technique can be used in alternative embodiments.

In one example, the circuitry holds the processor in a reset state until the NVM is ready, and only then releases the processor from the reset state. In another example, the boot code of the processor is stored in the NVM. The circuitry responds to a request from the processor for the boot code differently, depending on whether the NVM is ready or not. If the NVM is ready, the circuitry provides the processor with the requested boot code. If the NVM is not ready, the circuitry provides the processor with alternative code that prevents the processor from bootstrapping until the NVM is ready.

In an embodiment, the memory device comprises a processor-reset output pin that is coupled to the reset input of the processor. The memory device further comprises a processor-reset circuit that releases the reset input of the processor only after the memory device is ready. Alternatively, the reset input to the processor may be released slightly before the memory is ready, taking into consideration the time that the processor requires from release of reset to the start of the boot process.

In another embodiment of the present invention, the memory device does not comprise an extra reset-out pin, and the processor may access the memory device for booting before the memory device is ready (e.g., the processor and the memory device may share the same reset input). However, if the processor accesses the memory device while the memory device is not yet ready, the memory device will return to the processor an instruction or a sequence of instructions that will cause the processor to stall, instead of supplying the requested boot code. For example, the processor may repeatedly get a branch-to-self instruction. Only when the memory device is ready, the processor will get the real boot code stored in the memory device.

Thus, in embodiments according to the present invention, the memory device guarantees that the boot sequence of the processor will not start before the memory device is ready, either by applying a properly timed reset to the processor, or by stalling the processor using a stalling instruction or a stalling instruction sequence until the memory device is ready. No additional reset circuit is required, and the boot delay time is short.

System Description

In computer systems according to embodiments of the present invention, the boot code of a CPU may be stored in a non-volatile memory. In the description hereinbelow we will refer to non-volatile memory as Flash. While Flash is one possible technology for storing the boot code of computer systems, the disclosed techniques are not limited to Flash. Embodiments in accordance with the present invention may comprise any other type of non-volatile memory.

Various elements of the computer system, such as a flash device, may take different time periods to exit from reset (e.g., when power is applied to the system), and care must be taken to assure that the CPU will not begin executing its boot sequence before the flash memory is ready. For example, Flash memories typically run initialization sequences (e.g. built-in-self-test (BIST), or enforcement of security policies) when exiting reset; and may be ready to be accessed by the CPU long after the CPU is ready to access the Flash. It is imperative, therefore, that the CPU will start the boot sequence after the Flash is ready; hence, the reset sources of the CPU and the Flash are typically separate.

Flash-Device-Driven Processor Reset

In the example embodiments illustrated in FIG. 1 and below, the Flash device comprises a Processor Reset output signal, coupled to the CPU Reset input. The Flash device activates the processor reset when the Flash is not ready to be accessed, so that the CPU will boot from the Flash only when the Flash is ready.

FIG. 1 is a block diagram that schematically illustrates a computer system 100 with processor-reset that is generated by a Flash device having a system-reset input, in accordance with an embodiment of the present invention.

The system comprises a CPU 102, a RAM 104, Peripherals 106, and a Flash device 108. CPU 102 communicates with RAM 104, peripherals 106 and flash 108 over a bus 110 (bus 110 may comprise, for example, Advanced Microprocessor Bus Architecture (AMBA); in some embodiments bus 110 comprises AMBA and an interface module such as Serial-Processor-Interface (SPI) or Inter-Integrated-Circuit-Bus (I2C) that interfaces between the AMBA bus and the Flash device; in yet other embodiments other buses may be used).

Flash Device 108 comprises a non-volatile storage-array 112, which is configured to store data/code (for example—boot code), and to retain the stored data/code when the Flash device is not powered; an initialization circuit 114, and a processor-reset circuit 116. Array 112 and circuits 114 and 116 are typically packaged together in the same Integrated Circuit (IC) package.

Computer system 100 additionally comprises an External Reset source 118 that is coupled to the Flash device. In some embodiments, the external reset source comprises a power-on reset (POR) circuitry that activates a reset output when the power applied to the system is below a preset level (and, in some embodiments, for a preset time after the power has reached the preset level).

In the example embodiment of FIG. 1, when External Reset Source 118 deactivates its Reset output, initialization circuit 114 starts a Flash initialization sequence (e.g. BIST). When the initialization sequence is completed, the initialization circuit signals to processor reset circuit 116 that the Flash device is ready.

Processor-Reset Circuit 116 is configured to deactivate the processor-reset output of the Flash device only when the external reset signal is not active, and, when the Ready input, generated by initialization circuit 114, is active.

In some embodiments of the present invention, there is no external reset source, and the Flash device comprises a Power-On reset circuit.

Figure 2:
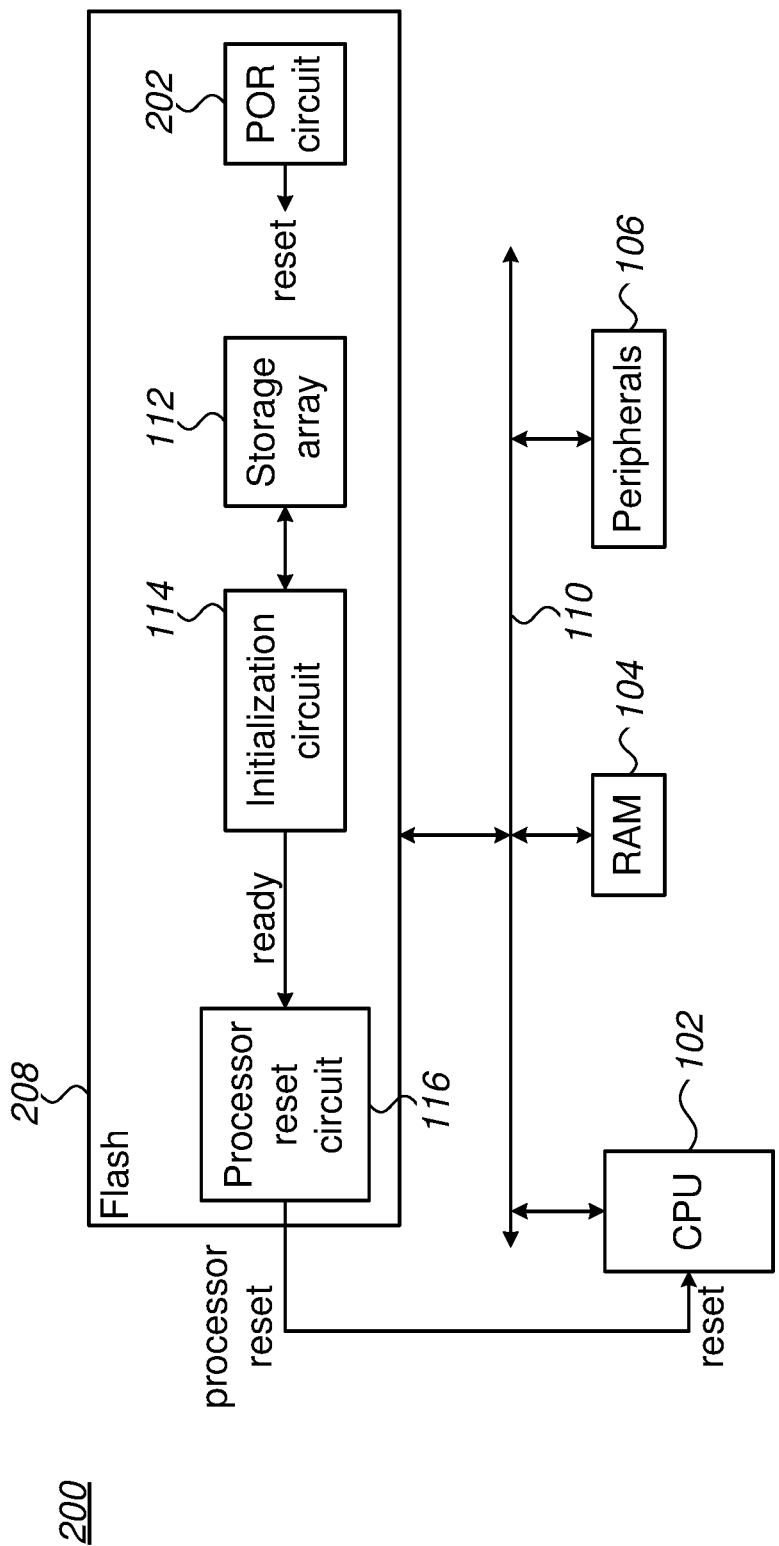
FIG. 2 is a block diagram that schematically illustrates a computer system with a processor-reset output that is generated by a Flash device having an internal POR circuit, in accordance with another embodiment of the present invention.

FIG. 2 is a block diagram that schematically illustrates a computer system 200 with a processor-reset output that is generated by a Flash device having an internal POR circuit, in accordance with an embodiment of the present invention. Like System 100 (FIG. 1), System 200 comprises a CPU 102, a RAM 104, Peripherals 106 and a Bus 110. However, unlike system 100, system 200 does not comprise and external reset source. Instead, Flash Device 208 comprises a Power-On-Reset (POR) circuit 202 (Flash 208 is otherwise identical to Flash 108 of FIG. 1).

POR circuit 202 is configured to deactivate a Reset output when the supply voltage of the Flash has reached a preset level. The reset output of POR circuit 202 is used for resetting Flash device 208 in lieu of a reset output from external reset source 118 (FIG. 1). In all other aspects, Flash 208 is identical to Flash 108: when POR circuit 202 deactivates its Reset output, initialization circuit 114 starts a Flash initialization sequence; when the initialization sequence is completed, the initialization circuit signals that the Flash device is ready; processor-Reset Circuit 116 will then deactivate the processor-reset output of the Flash device, allowing CPU 102 to start the boot process.

Thus, according to the example embodiments of FIGS. 1 and 2, the CPU will access the Flash only when the Flash is ready, and the boot code that the CPU executes will not be corrupted. By coupling the reset input of the CPU to the Flash, the boot sequence of the CPU can be correctly timed—it will not start before the Flash is ready, and it will not be unnecessarily delayed.

The configurations of computer systems 100 and 200, and of Flash devices 108 and 208, are example configurations that are shown purely for the sake of conceptual clarity. Any other suitable configurations can be used in alternative embodiments. For example, Flash memories 108 and 208 may be replaced with any other type of non-volatile memory or storage devices, such as Electrically-Erasable Programmable Read-Only Memory (EEPROM) or Read-Only Memory (ROM) and hard disk; CPU 102 may comprise a plurality of CPU units, of the same or of various types; and, there may be more than one Flash memory and more than one bus in the system.

As the CPU may take some time to exit reset, in some embodiments the processor reset output is deactivated a preset time before initialization circuit 114 completes the initialization, so that the boot will not be unnecessarily delayed. In some embodiments, the processor reset output deactivation may be delayed by a preset time after the Flash is ready, and in yet other embodiments Flash 108 (or 208) may comprise a plurality of processor-reset outputs, which may be coupled to a plurality of processors and other system components, wherein the reset-deactivation of each output, with respect to the external-reset input (or the POR reset) and to the time that the Flash is ready, may be separately configured.

In the present context, initialization circuit 114, processor-reset circuit 116 and POR circuit 202 (if used) are referred to collectively as the "circuitry" of the Flash device. In alternative embodiments, any other suitable circuitry configuration can be used.

Figure 3:
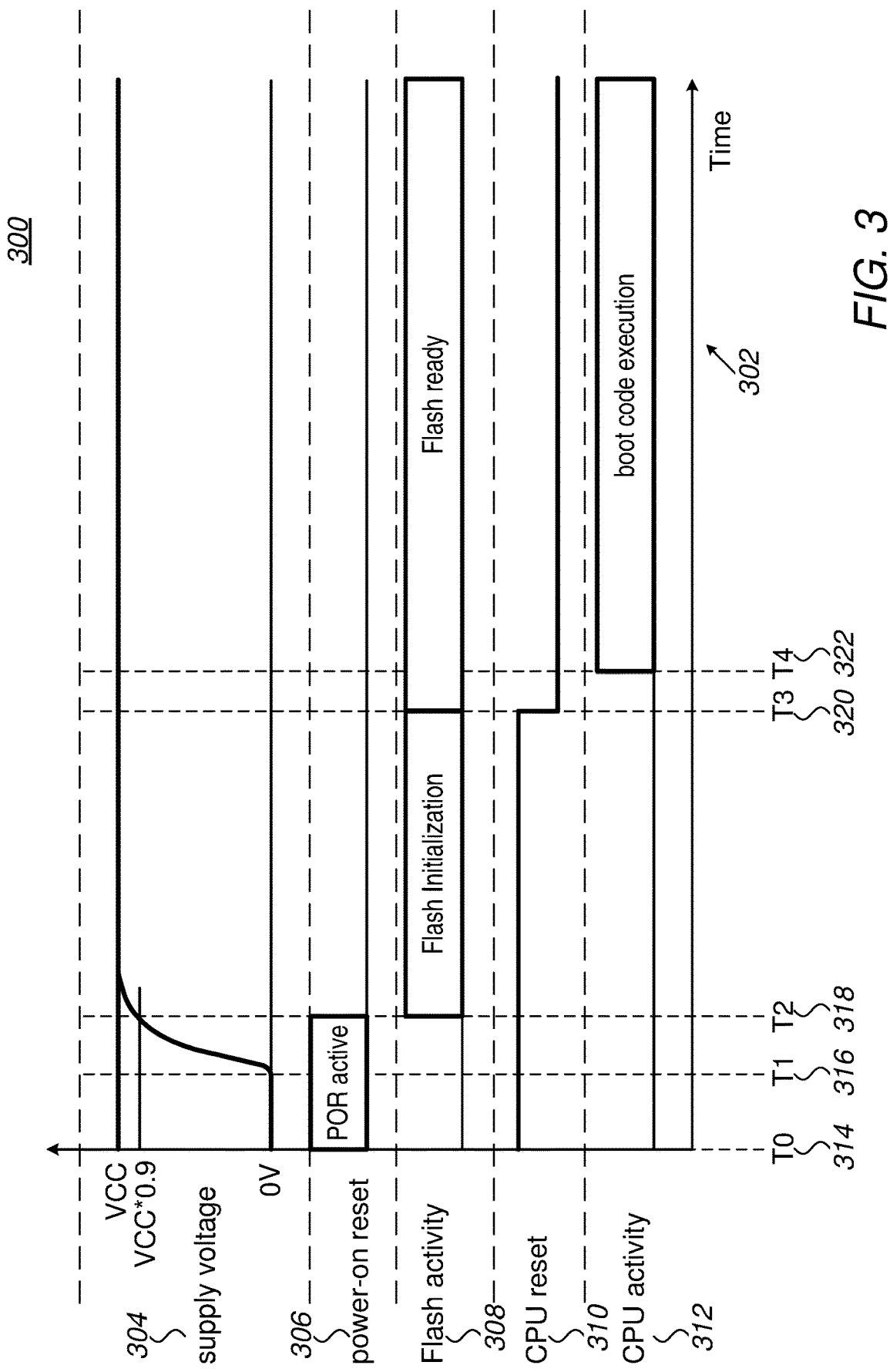
FIG. 3 is a timing diagram that schematically illustrates the boot sequence of a computer system with a Flash-device generated processor reset, in accordance with embodiments of the present invention.

FIG. 3 is a timing diagram 300 that schematically illustrates the boot sequence of a computer system with a Flash-device generated processor reset, e.g., the systems of FIGS. 1 and 2 above, in accordance with embodiments of the present invention. The diagram describes activities in the form of graphs along a time axis 302: a supply voltage graph 304, a power-on reset graph 306, a Flash Activity graph 308, a CPU Reset graph 310, and a CPU Activity graph 312. Five significant time events are marked along the time axis—T0 to T4.

The time axis starts at a Time-Event T0 (314). The supply voltage level is 0 volt, and the system is inactive. At a Time-Event T1 (316), the supply voltage starts ramping, powering-up the system; and at a Time-Event T2 (318), the supply voltage reaches a preset level (90% of VCC in the example embodiment illustrated in FIG. 3). The POR unit will remain in Reset until a Time-Event T2 (318). Flash initialization starts When the POR exists reset and ends at a time-event T3 (320).

CPU Reset (graph 310) is held (by the Flash device) active from T0 to T3. At T3, the Flash device releases the CPU reset. Shortly afterwards, at a time event T4 (322), the CPU will access the Flash device, to execute the boot sequence (the time period from T3 to T4 may be required by the CPU for some post-reset pre-boot operations).

Thus, according to the timing chart illustrated in FIG. 3, the CPU will access the Flash only when the Flash device is ready, with short delay.

Timing chart 300 illustrated in FIG. 3 is not drawn to scale, and longer horizontal distances do not necessarily imply longer respective time periods. Moreover, timing chart 300 is an example chart that is shown purely for the sake of conceptual clarity. Any other suitable timing charts may be used in alternative embodiments of the present invention. For example, in some embodiments, CPU Reset 310 may terminate slightly before the Flash initialization is completed, to shorten the delay from the time that Flash initialization completes to T4 (322).

Boot-Code Manipulation

In some applications, it may be undesirable or infeasible to add a processor-reset pin to the Flash device; for example, the pins of the Flash may adhere to a pinout standard, or the Flash must be pin-compatible with some other Flash devices. According to embodiments of the present invention that are presented herewith, the CPU may start its boot process before the Flash is ready, but the Flash device will modify the boot code that the CPU reads, effectively forcing the CPU to wait until the Flash is ready.

Figure 4:
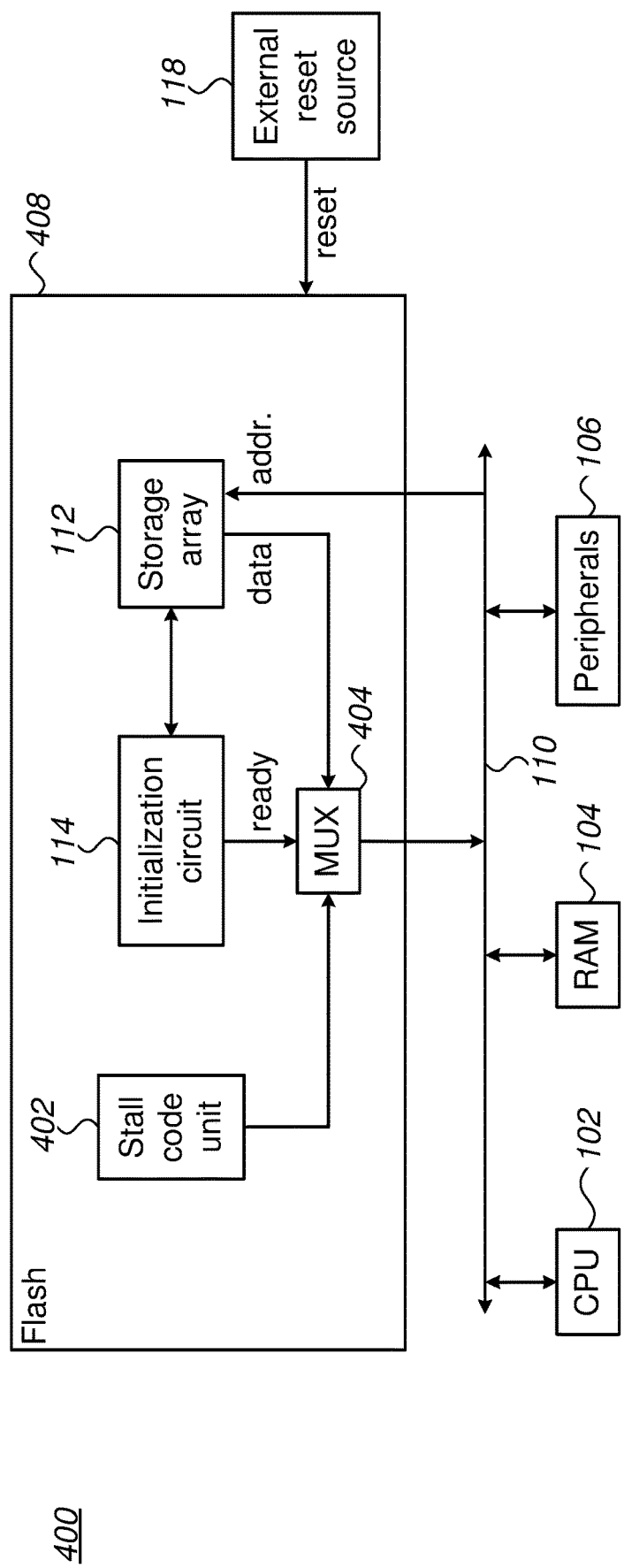
FIG. 4 is a block diagram that schematically illustrates a computer system with a modified boot instruction that is generated by a Flash device, in accordance with an embodiment of the present invention.

FIG. 4 is a block diagram that schematically illustrates a computer system 400 with a modified boot instruction that is generated by a Flash device, in accordance with an embodiment of the present invention. The system comprises a CPU 102, a RAM 104, Peripherals 106, a Bus 110 and an External Reset Source 118—that may all be identical to respective units of system 100 (FIG. 1).

A Flash device 408 comprises a storage array 112 and an initialization circuit 114; both may be identical to the corresponding units of system 100. Additionally, Flash 408 comprises a Stall-Code unit 402, and a multiplexor (MUX) 404.

Stall-code unit 402 is configured to output a computer instruction that will cause the CPU to stall. For example, the instruction may be branch-to-self ("b") instruction that would cause the CPU to continue reading the instruction from the same location indefinitely. The code of the stall instruction may be hard-wired, or, stored in non-volatile cells of Flash 408.

Initialization Circuit 114 is coupled to multiplexor 404, which is configured to route to bus 110 data that Stall Code 402 outputs when the initialization circuit indicates that the Flash is not ready, or, data that storage array 112 outputs when the initialization circuit indicates that the Flash is ready.

Thus, according to the example configuration illustrated in FIG. 4, the CPU may start the boot sequence when the Flash is not ready, but the instruction that the CPU will read will cause the CPU to stall. When the Flash is ready, as indicated by Initialization Circuit 114, the CPU will read the correct boot sequence from storage-array 112.

Figure 5:
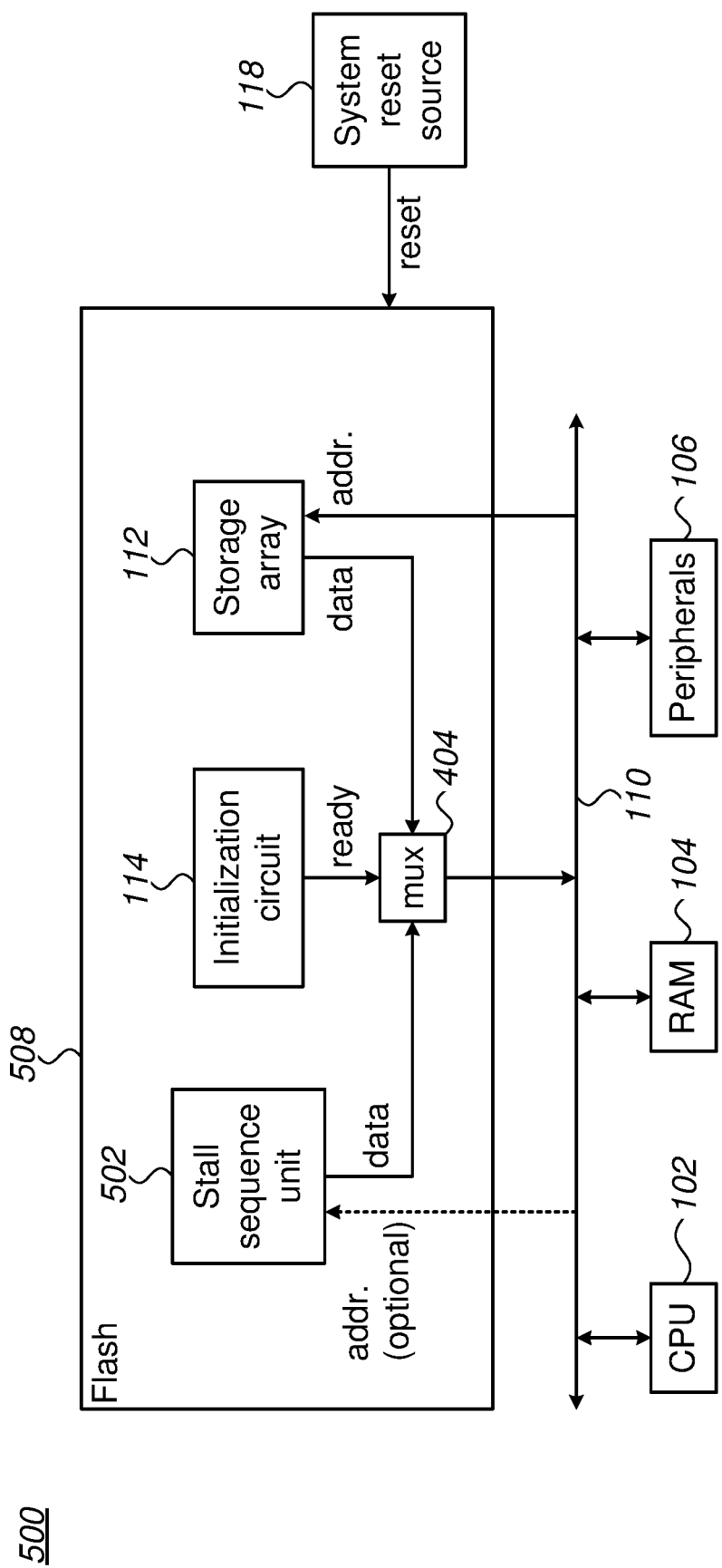
FIG. 5 is a block diagram that schematically illustrates a computer system with a modified boot sequence that is generated by a Flash device, in accordance with yet another embodiment of the present invention.

FIG. 5 is a block diagram that schematically illustrates a computer system 500 with modified boot sequence that is generated by a Flash device, in accordance with an embodiment of the present invention. System 500 is identical to system 400 of FIG. 4, and Flash 508 is identical to Flash 408, except that Flash 508 comprises a Stall Sequence unit 502, in lieu of Stall Instruction unit 402 of Flash 408.

Stall Sequence unit 508 comprises a sequence of instructions that the CPU will execute when the Flash is not ready (a detailed example, pertaining to the instruction set of an ARM processor, will be described below). The stall-sequence unit keeps track of the accesses done by the CPU and sends the corresponding data to Multiplexor 404 (in an alternative embodiment, the address part of bus 110 is input to stall-sequence unit 502, and the stall sequence unit sends data respective to the input address).

The code for the sequence of instructions may be hard-wired, or else stored in non-volatile cells of Flash 508 (in some embodiments, the code for the sequence of instructions is stored in a different Flash bank than the boot code; in other embodiments the sequence of instructions is transferred to volatile memory (e.g., Flip Flops or SRAM memory) from the Flash cells shortly after reset, and then read from the volatile memory). The multiplexor transfers data from stall-sequence-unit 503 when the Flash is not ready (as indicated by Initialization Circuit 114), and from storage array 112 when the Flash is ready.

Thus, according to the example configuration of FIG. 5, the CPU may execute a preset sequence of instructions when the Flash is not ready, and, execute the boot sequence, stored in storage-array 112, when the Flash is ready.

In some embodiments, switching from the execution of the stall sequence to the execution of the boot sequence must be done at a known CPU state (rather than at any instruction of the instruction sequence), to assure coherency. Flash 508 may comprise circuitry, configured to delay the ready indication until the sequence reaches a preset stage (for example, a preset address is input from bus 110), assuring that transfer from the stall sequence to the boot sequence will be done at the right CPU state.

As would be appreciated, the configurations of Flash 408 and 508, mux 404, initialization circuit 114 and storage array 112, illustrated in FIGS. 4 and 5, are example configurations that are shown purely for the sake of conceptual clarity. Any other suitable configurations can be used in alternative embodiments. For example, multiplexor 404 may be embedded in a bank-select logic of the Flash array; for another example, in some embodiments a subset of the address wires of bus 110 are input to the stall-sequence unit.

In the present context, initialization circuit 114, stall-code unit 402 or 502, and MUX 404, are referred to collectively as the "circuitry" of the Flash device. In alternative embodiments, any other suitable circuitry configuration can be used.

Figure 6:
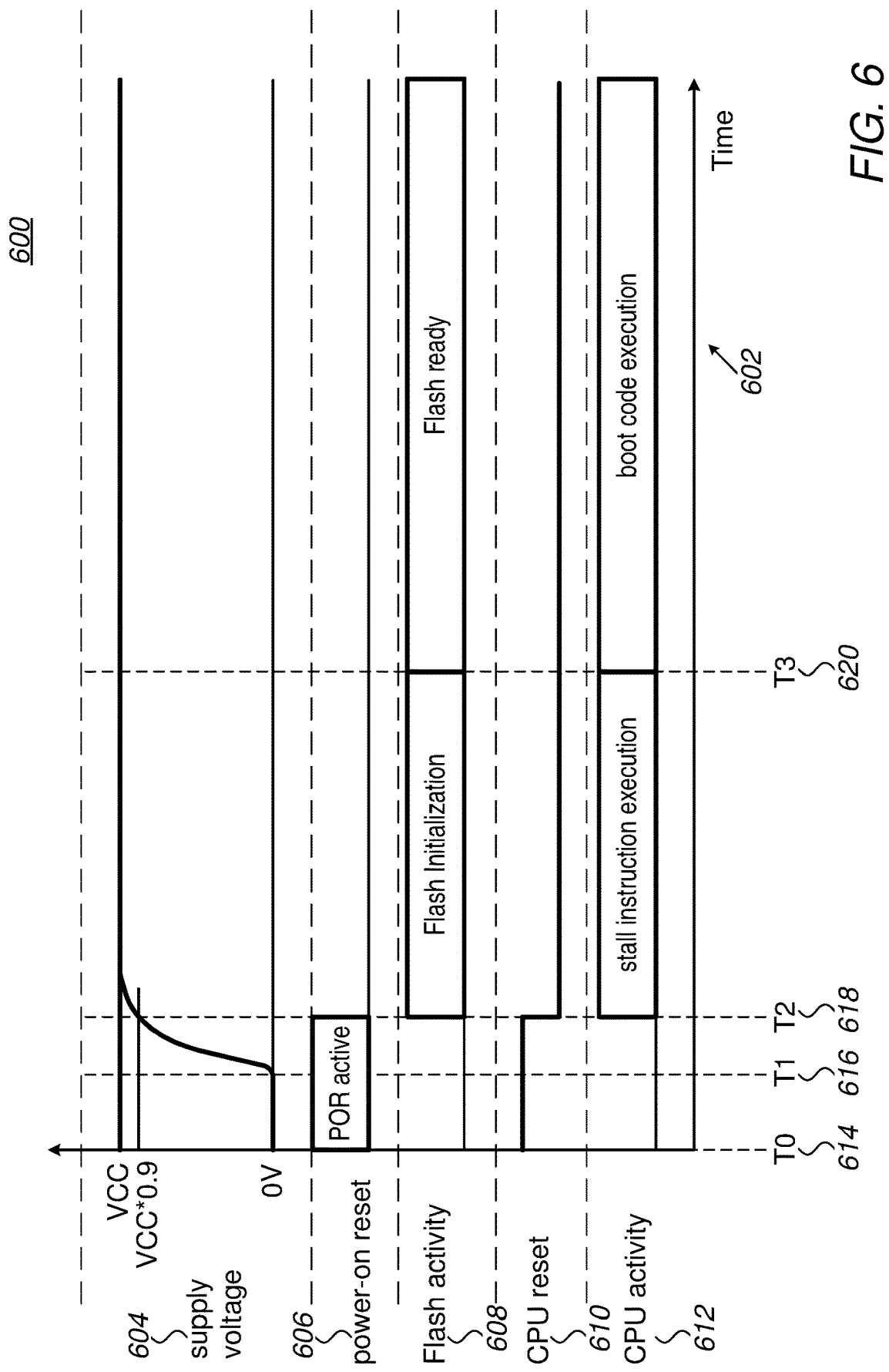
FIG. 6 is a timing diagram that schematically illustrates the boot sequence of a computer system with a processor-stall, in accordance with some embodiments of the present invention.

FIG. 6 is a timing diagram 600 that schematically illustrates the boot sequence of a computer system with a processor-stall, in accordance with some embodiments of the present invention. The diagram describes activities in the form of graphs along a time axis 602: a supply voltage graph 604, a power-on reset graph 606, a Flash Activity graph 608, a CPU Reset graph 610, and a CPU Activity graph 612 (Graphs 604, 606 and 608 are identical, respectively, to graphs 304, 306 and 308 of timing chart 300, illustrated in FIG. 3).

Four significant time events are marked along the time axis—T0 to T3.

The time axis starts at a Time-Event T0 (614). The supply voltage level is 0 volt, and the system is inactive. At a Time-Event T1 (616), the supply voltage starts ramping, powering-up the system; and at a Time-Event T2 (618), the supply voltage reaches a preset level (e.g. ~90% of VCC in the example embodiment illustrated in FIG. 3). The POR unit will remain in Reset until a Time-Event T2 (618). Flash initialization starts When the POR exists reset and ends at a time-event T3 (620).

CPU Reset (graph 610) is released at T2 (618), and the CPU attempts to boot, reading data from the Flash device. However, during the time that the Flash devices initializes (from T2 to T3), the CPU will read a Stall code from the Flash. Only when Flash initialization is complete, will the CPU read actual boot data from the Flash, and execute the boot sequence.

Thus, according to timing chart 600 illustrated in FIG. 6, the CPU will exit from reset when the Flash is initializing but will read stall code from the Flash until the initialization is complete. The CPU will read actual boot code from the Flash only when the Flash is ready.

Timing chart 600 illustrated in FIG. 6 is not drawn to scale, and longer horizontal distances do not necessarily imply longer respective time periods. Moreover, timing chart 600 is an example chart that is shown purely for the sake of conceptual clarity. Any other suitable timing charts may be used in alternative embodiments of the present invention.

Stall-Instruction Example

In some processor architectures, the processor boot sequence may read the boot code from address 0x00000000.

When the Flash device is not ready, the stall-instruction unit 402 (FIG. 4) will send to the CPU a loop of "Branch to self" instructions ('b .').

The stall sequence that the CPU will execute is:

'b .' // Branch self instruction
'b .' // Branch self instruction
'b .' // Branch self instruction
. . . .
'b .' // Branch self instruction The boot code is stored in storage array 112, starting at address 0x0000.

Stall Sequence Example

In some processor architecture, the processor boot sequence first loads some data or configurations from the memory device (e.g., Instruction Pointer, Stack Pointer, etc.) and only then starts executing the main boot code.

The boot sequence may, for example, comprise the following sequence:

1. Load a word from address 0 into the Stack Pointer (SP) register;

2. Load a word from address 4 into the program counter (PC) register
3. Start code execution from the address pointed to by the PC.

To allow the memory device to finish its internal reset sequence, stall sequence unit 502 will return: a value for the PC and the SP when addresses 0 or 4 are accessed, and a Branch to self ("b.") instruction when the address stored at location 0 is accessed. The CPU will read addresses 0 and 4 only once and then keep reading the branch-to-self instruction, until the Flash device is ready.

For example, if the boot vector comprises:
0x000: 0x20001000 // value for SP
0x004: 0x00000100 // value for PC
. . .
0x100: [Boot code begins here]

The Flash device will send the following sequence to the CPU when not ready:
upon first access—0x20001000 // SP initialization
upon second access—0x00000100// PC initialization
upon further accesses—"b." // branch to self code The configurations of computer system 100, 200, 400 and 500; the configuration of Flash devices 108, 208, 408 and 508; and the configuration of the other units described hereinabove with respect to FIGS. 1, 2, 4 and 5 are example configurations that are shown purely for the sake of conceptual clarity. Any other suitable configurations can be used in alternative embodiments, including, for example, system configurations with a plurality of Flash devices and/or a plurality of CPU units, some or all of which having separate reset inputs.

Some of the elements described in FIGS. 1, 2, 4 and 5 may be implemented using suitable hardware, such as in an Application-Specific Integrated Circuit (ASIC) or Field-Programmable Gate Array (FPGA), using software, using hardware, or using a combination of hardware and software elements.

Although the embodiments described herein mainly address computer systems with embedded non-volatile memory, the methods and systems described herein can also be used in other applications, such as in computer systems with other storage devices, e.g., hard-disks.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A memory device, comprising:
a non-volatile memory (NVM), which is configured to store boot code of a processor; and
circuitry, configured to:
initialize and prepare the NVM for executing memory-access operations for a processor; and
ascertain that no memory-access operations are received from the processor before the NVM is ready, by responding to a request from the processor for the boot code during at least part of initialization and preparation of the NVM by providing an alternative code for execution by the processor, such that while executing the alternative code, the processor is prevented from bootstrapping,
wherein the alternative code comprises a first part that is executed once, and a second part that is executed repeatedly until the at least part of the initialization and preparation of the NVM is complete.

2. The memory device according to claim 1, wherein the circuitry is configured to
respond to a subsequent request from the processor for the boot code after the at least part of the initialization and preparation of the NVM by providing the boot code.

3. The memory device according to claim 1, wherein the alternative code causes the processor to repeatedly loop until the at least part of the initialization and preparation of the NVM is complete.

4. The memory device according to claim 1, wherein the first part comprises instructions that load a register of the processor.

5. The memory device according to claim 1, wherein the NVM and the circuitry are packaged in a same Integrated Circuit (IC) package.

6. A method in a memory device, comprising:
using circuitry in the memory device, initializing and preparing a non-volatile memory (NVM) in the memory device for executing memory-access operations for a processor;
storing boot code of the processor in the NVM; and
ascertaining, by the circuitry in the memory device, that no memory-access operations are received from the processor before the NVM is ready, by responding to a request from the processor for the boot code during at least part of initialization and preparation of the NVM by providing an alternative code for execution by the processor, such that while executing the alternative code, the processor is prevented from bootstrapping,
wherein the alternative code comprises a first part that is executed once, and a second part that is executed repeatedly until the at least part of the initialization and preparation of the NVM is complete.

7. The method according to claim 6, and comprising
after the at least part of the initialization and preparation of the NVM, responding to a subsequent request from the processor for the boot code by providing the boot code.

8. The method according to claim 6, wherein the alternative code causes the processor to repeatedly loop until the at least part of the initialization and preparation of the NVM is complete.

9. The method according to claim 6, wherein the first part comprises instructions that load a register of the processor.

10. The method according to claim 6, wherein the NVM and the circuitry are packaged in a same Integrated Circuit (IC) package.

\* \* \* \* \*